United States Patent
Zhang et al.

(10) Patent No.: US 8,552,790 B2
(45) Date of Patent: Oct. 8, 2013

(54) HARMONIC REJECTION OF SIGNAL CONVERTING DEVICE AND METHOD THEREOF

(75) Inventors: Huajiang Zhang, Singapore (SG); Chun Giek Tan, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 128 days.

(21) Appl. No.: 13/103,102

(22) Filed: May 8, 2011

(65) Prior Publication Data

US 2012/0019305 A1      Jan. 26, 2012

Related U.S. Application Data

(60) Provisional application No. 61/366,438, filed on Jul. 21, 2010.

(51) Int. Cl.
*G06G 7/12*        (2006.01)
*H04B 1/10*        (2006.01)

(52) U.S. Cl.
USPC ............ 327/355; 455/303; 455/317; 455/323

(58) Field of Classification Search
USPC ........... 327/355, 356; 375/346, 349; 455/296, 455/303–305, 313, 317, 323
See application file for complete search history.

(56) References Cited

U.S. PATENT DOCUMENTS

| | | | | |
|---|---|---|---|---|
| 7,421,259 B2 * | 9/2008 | Gomez et al. | ................. | 455/130 |
| 7,509,110 B2 * | 3/2009 | Hayashi et al. | ................ | 455/302 |
| 8,285,240 B2 * | 10/2012 | Seendripu et al. | ............ | 455/317 |
| 2006/0160518 A1 * | 7/2006 | Seendripu et al. | ............ | 455/323 |
| 2008/0076375 A1 | 3/2008 | Cooley | | |
| 2008/0284487 A1 * | 11/2008 | Pullela et al. | ................. | 327/355 |
| 2009/0156155 A1 * | 6/2009 | Krug et al. | ..................... | 455/313 |
| 2011/0076961 A1 * | 3/2011 | Feng et al. | ................. | 455/67.14 |

FOREIGN PATENT DOCUMENTS

WO    WO 2010089700 A1 *   8/2010

OTHER PUBLICATIONS

Hyouk-Kyu Cha, IEEE Microwave and Wireless Components Letters, "A CMOS Harmonic Rejection Mixer With Mismatch Calibration Circuitry for Digital TV Tuner Applications", Sep. 2008, 617-619,vol. 18, No. 9.

Niels A. Moseley, "A 400-to-900 MHz Receiver with Dual-domain Harmonic Rejection Exploiting Adaptive Interference Cancellation", RF Building Blocks , Feb. 10, 2009, 232-233, Figure 12.9.7.

* cited by examiner

*Primary Examiner* — Patrick O'Neill (74) *Attorney, Agent, or Firm* — Winston Hsu; Scott Margo (57) ABSTRACT

A signal converting device includes: a reference signal-mixing circuit arranged to generate a reference mixing output signal according to an input signal, a reference gain, and a reference local oscillating signal; a plurality of auxiliary signal-mixing circuits, each arranged to generate an auxiliary mixing output signal according to the input signal, an auxiliary gain, and an auxiliary local oscillating signal; and a combining circuit arranged to combine the reference mixing output signal and a plurality of the auxiliary mixing output signals to generate an output signal, and at least one of the auxiliary signal-mixing circuits is configured by the corresponding auxiliary gain to compensate phase imbalances between the reference mixing output signal and each of the auxiliary mixing output signals to reduce a power of a harmonic component in the output signal.

26 Claims, 7 Drawing Sheets

HARMONIC REJECTION OF SIGNAL CONVERTING DEVICE AND METHOD THEREOF

CROSS REFERENCE TO RELATED APPLICATIONS

This application claims the benefit of U.S. Provisional Application No. 61/366,438, which was filed on 2010, Jul. 21 and is included herein by reference.

BACKGROUND

The present invention relates to a signal converting device and a method thereof, and more particularly to a signal converting device with harmonic rejection and a related harmonic rejection method.

In a wireless communication system, an oscillating signal having an oscillating frequency can be utilized to mix with a radio frequency (RF) signal to convert the RF signal into a converted RF signal. For example, in a receiver, a received RF signal is down-converted into a baseband signal by mixing the receiving RF signal with an oscillating signal having an oscillating frequency of the carrier frequency of the received RF signal. However, when the oscillating signal is not an ideal oscillating signal with the oscillating frequency, e.g., when the signal with harmonic frequency exists in the oscillating signal, the signal with harmonic frequency may mix with the interference signal to generate another down-converted signal near to or overlapping the baseband signal. Then, the wanted baseband signal may be contaminated by the down-converted interference signal. In other words, the signal with harmonic frequency may degrade the noise figure of the baseband signal. Therefore, how to reduce the effect caused by the harmonic signal of the oscillating signal in the wireless communication system has become an important issue in this field.

SUMMARY

One of the objectives of the present invention is therefore to provide a signal converting device with harmonic rejection and a related harmonic rejection method to solve the above-mentioned problem.

According to a first embodiment of the present invention, a signal converting device is disclosed. The signal converting device comprises a reference signal-mixing circuit, a plurality of auxiliary signal-mixing circuits, and a combining circuit. The reference signal-mixing circuit is arranged to generate a reference mixing output signal according to an input signal, a reference gain, and a reference local oscillating signal. Each of the auxiliary signal-mixing circuits is arranged to generate an auxiliary mixing output signal according to the input signal, an auxiliary gain, and an auxiliary local oscillating signal. The combining circuit is arranged to combine the reference mixing output signal and a plurality of the auxiliary mixing output signals to generate an output signal, wherein at least one of the auxiliary signal-mixing circuits is configured by the corresponding auxiliary gain to compensate phase imbalances between the reference mixing output signal and each of the auxiliary mixing output signals to reduce a power of a harmonic component in the output signal.

According to a second embodiment of the present invention, a signal converting device is disclosed. The signal converting device comprises a plurality of signal-mixing circuits and a combining circuit. The plurality of signal-mixing circuits are arranged to receive an input signal and local oscillating signals having different phases, wherein each of the signal-mixing circuits is arranged to receive a different one of the local oscillator signals and being adapted to: apply a gain to the input signal to generate an amplified input signal, the gain being set according to a relationship of harmonic rejection ratios with respect to amplitude mismatches of the signal-mixing circuits; and generate an amplitude modulated mixed signal indicative of a product of the amplified input signal and the local oscillator signal. The combining circuit is arranged to combine the amplitude modulated mixed signals generated by the signal-mixing circuits to provide an output signal.

According to a third embodiment of the present invention, a harmonic rejection method is disclosed. The harmonic rejection method comprises: generating a reference mixing output signal according to an input signal, a reference gain, and a reference local oscillating signal; generating a plurality of auxiliary mixing output signals each according to the input signal, an auxiliary gain, and an auxiliary local oscillating signal; combining the reference mixing output signal and the auxiliary mixing output signals to generate an output signal; and at least one of the auxiliary gains is configured to compensate phase imbalances between the reference mixing output signal and each of the auxiliary mixing output signals to reduce a power of a harmonic component in the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
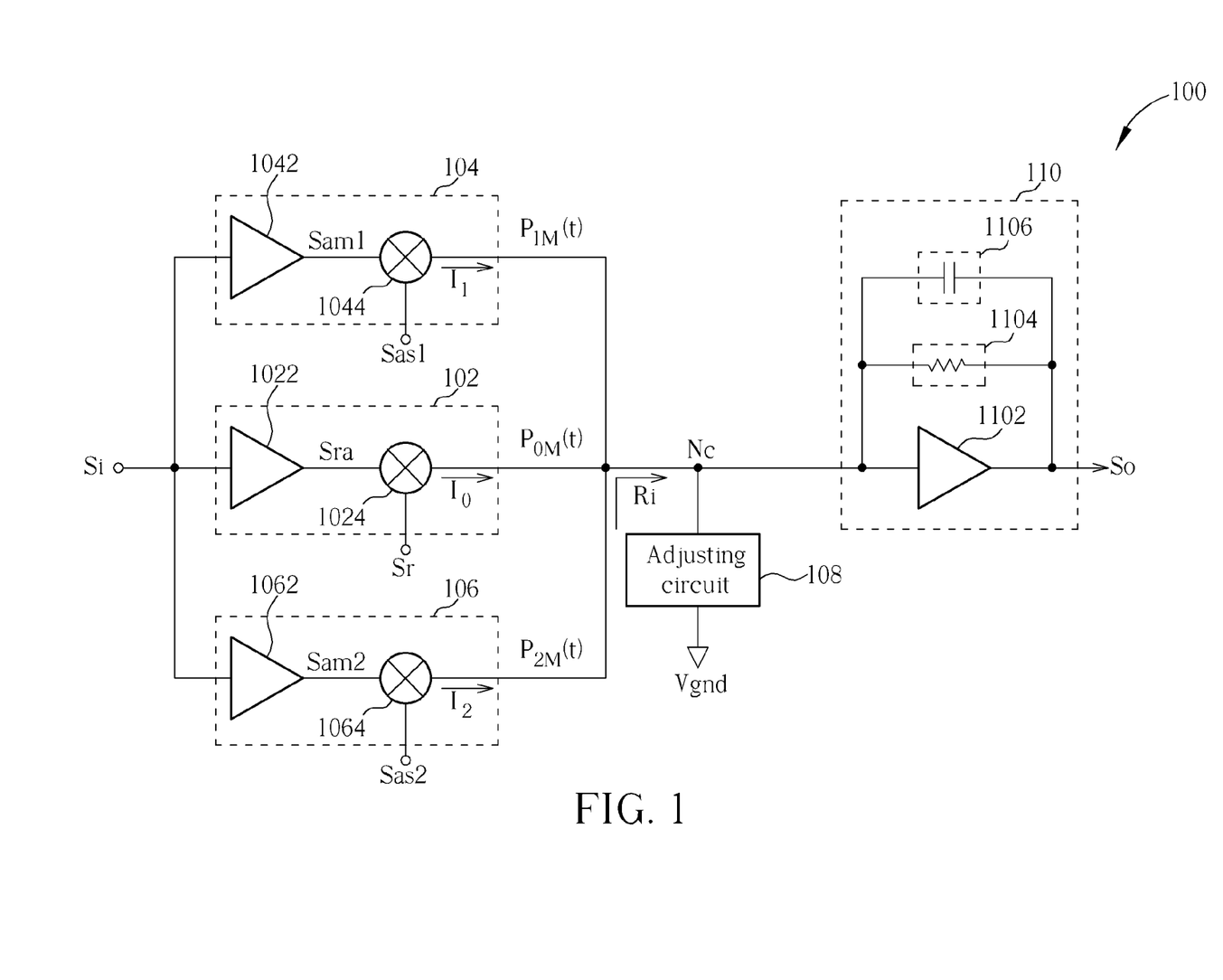
FIG. 1 is a diagram illustrating a signal converting device according to an embodiment of the present invention.

FIG. 1 is a diagram illustrating a signal converting device 100 according to an embodiment of the present invention. The signal converting device 100 may be applied to implement a harmonic rejection mixer (HRM) of a television tuner, a FM (Frequency Modulation) tuner, or any other wideband application. The signal converting device 100 comprises a reference signal-mixing circuit 102, a plurality of auxiliary signal-mixing circuits 104, 106, and a combining circuit 110. The reference signal-mixing circuit 100 is arranged to generate a reference mixing output signal $P_{OM}(t)$ according to an input signal Si, a reference gain Ar, and a reference square wave Sr. The first auxiliary signal-mixing circuit 104 is arranged to generate a first auxiliary mixing output signal $P_{1M}(t)$ according to the input signal Si, a first auxiliary gain Aa1, and a first auxiliary square wave Sas1. The second auxiliary signal-mixing circuit 106 is arranged to generate a second auxiliary mixing output signal $P_{2M}(t)$ according to the input signal Si, a second auxiliary gain Aa2, and a second auxiliary square wave Sas2. The combining circuit 110 is arranged to combine the reference mixing output signal $P_{OM}(t)$, the first auxiliary mixing output signal $P_{1M}(t)$, and the second auxiliary mixing output signal $P_{2M}(t)$ to generate an output signal So, wherein the reference signal-mixing circuit 102 is configured by the reference gain Ar, the first auxiliary signal-mixing circuit 104 is configured by the first auxiliary gain Aa1, and the second auxiliary signal-mixing circuit 106 is configured by the second auxiliary gain Aa2. In addition, at least one of the first auxiliary gain Aa1 and the second auxiliary gain Aa2 is arranged to compensate phase imbalances between the reference mixing output signal $P_{OM}(t)$ and the auxiliary mixing output signals $P_{1M}(t)$, $P_{2M}(t)$ to reduce a power of a harmonic component in the output signal So.

It should be noted that the corresponding auxiliary gains Aa1, Aa2 of the first and second auxiliary signal-mixing circuit 104, 106 are set according to a relationship of harmonic rejection ratios with respect to amplitude mismatches of the reference signal-mixing circuit 102 and the auxiliary signal-mixing circuits 104, 106. In another embodiment, the corresponding auxiliary gains Aa1, Aa2 of the first and second auxiliary signal-mixing circuit 104, 106 are set according to an oscillating frequency of the auxiliary local oscillating signals (i.e., Sas1, Sas2).

In this exemplary embodiment, the combining circuit 110 may be implemented by a trans-impedance amplifier (TIA), and the trans-impedance amplifier comprises an amplifier 1102, a feedback resistor 1104, and a feedback capacitor 1106. However, it is not a limitation of the present invention, the combining circuit 110 may also be other circuits having the ability to combine signals. The feedback resistor 1104 and the feedback capacitor 1106 are connected in parallel, and having one node coupled to the output terminal of the amplifier 1102 and the other node coupled to the input terminal of the amplifier 1102. It should be noted that, in another exemplary embodiment of the present invention, the combining circuit 110 may also be an adder for adding up the reference mixing output signal $P_{OM}(t)$, the first auxiliary mixing output signal $P_{1M}(t)$, and the second auxiliary mixing output signal $P_{2M}(t)$ to generate the output signal So.

In this exemplary embodiment, the signal converting device 100 further comprises an adjusting circuit 108. The adjusting circuit 108 is coupled to a common output node Nc of the reference signal-mixing circuit 102 and the auxiliary signal-mixing circuits 104, 106, and the adjusting circuit 108 is arranged to adjust an input impedance Ri of the combining circuit 110 to reduce the power of the interference signal at node Nc.

Furthermore, in this exemplary embodiment, the reference signal-mixing circuit 102 comprises a reference gain stage 1022 and a reference mixer 1024. The reference gain stage 1022 is arranged to provide the reference gain Ar upon the input signal Si to generate a reference amplified signal Sra. The reference mixer 1024 is arranged to modulate (e.g., up-convert or down-convert) the reference amplified signal Sra according to the reference square wave Sr to generate the reference mixing output signal $P_{OM}(t)$. The first auxiliary signal-mixing circuit 104 comprises an auxiliary gain stage 1042 and an auxiliary mixer 1044. The auxiliary gain stage 1042 is arranged to provide the first auxiliary gain Aa1 upon the input signal Si to generate a first auxiliary amplified signal Sam1. The auxiliary mixer 1044 is arranged to modulate (e.g., up-convert or down-convert) the first auxiliary amplified signal Sam1 according to the first auxiliary square wave Sas1 to generate the first auxiliary mixing output signal $P_{1M}(t)$. The second auxiliary signal-mixing circuit 106 comprises an auxiliary gain stage 1062 and an auxiliary mixer 1064. The auxiliary gain stage 1062 is arranged to provide the second auxiliary gain Aa2 upon the input signal Si to generate a second auxiliary amplified signal Sam2. The auxiliary mixer 1064 is arranged to modulate (e.g., up-convert or down-convert) the second auxiliary amplified signal Sam2 according to the second auxiliary square wave Sas2 to generate the second auxiliary mixing output signal $P_{2M}(t)$. It should be noted that the reference mixer 1024, auxiliary mixers 1044, 1064 may be active mixer or passive mixer.

Figure 2:
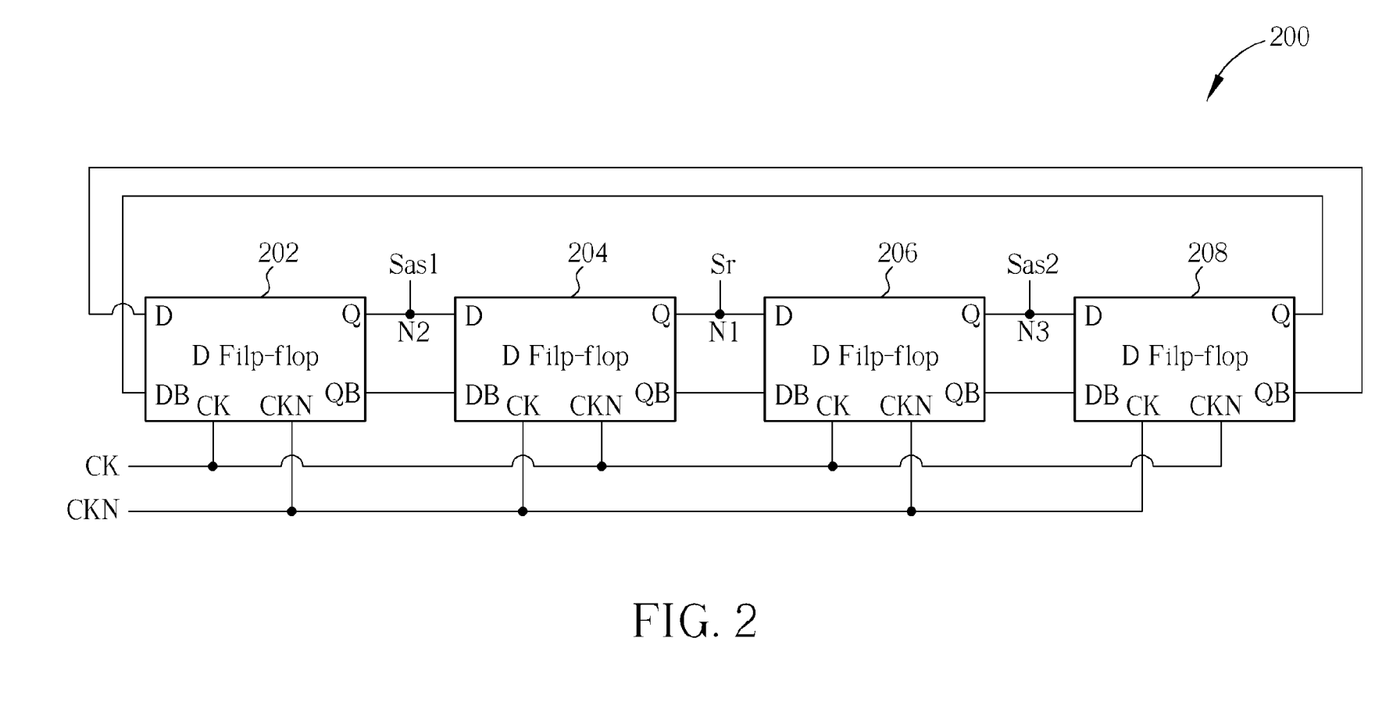
FIG. 2 is a diagram illustrating a square wave generator according to an embodiment of the present invention.

Furthermore, FIG. 2 is a diagram illustrating a square wave generator 200 according to an embodiment of the present invention. The square wave generator 200 is arranged to generate the reference square wave Sr, the first auxiliary square wave Sas1, and the second auxiliary square wave Sas2 for the signal converting device 100. More specifically, the reference square wave Sr is coupled to the reference mixer 1024, the first auxiliary square wave Sas1 is coupled to the auxiliary mixer 1044, and the second auxiliary square wave Sas2 is coupled to the auxiliary mixer 1064. The square wave generator 200 comprises a first D flip-flop 202, a second D flip-flop 204, a third D flip-flop 206, and a fourth D flip-flop 208, each D flip-flop is controlled by a differential clock pair CK, CKN, and has four nodes D, DB, Q, QB. In addition, the four D flip-flops 202, 204, 206, 208 are arranged to couple as a negative feedback loop as shown in FIG. 2. Accordingly, eight different square waves can be generated by the square wave generator 200, in which the phase difference between two adjacent square waves is 45°. In this exemplary embodiment, the reference square wave Sr with the phase of 0°, the first auxiliary square wave Sas1 with the phase of 315°, and the second auxiliary square wave Sas2 with the phase of 45° are outputted at the three terminals N1, N2, N3 respectively.

Figure 3:
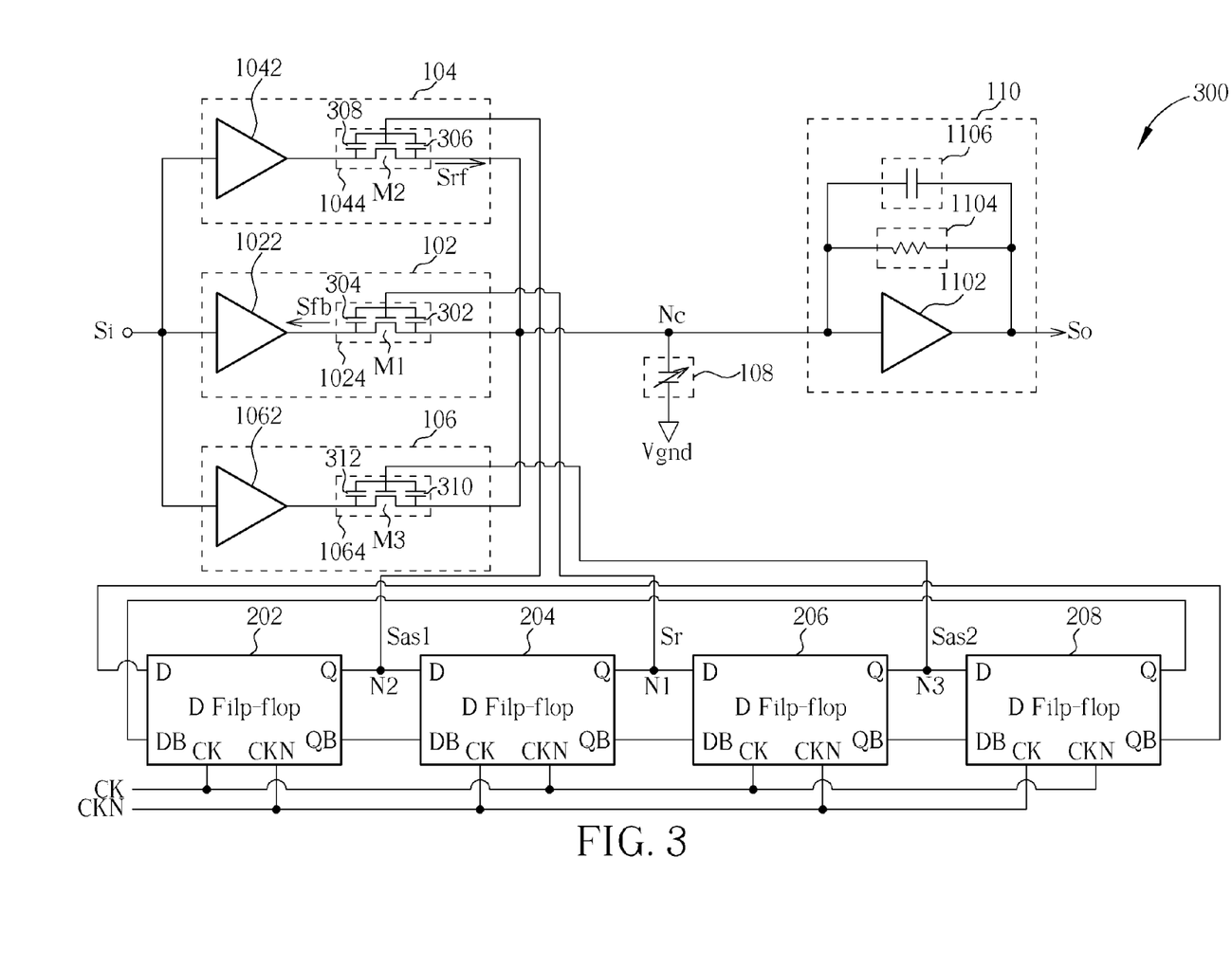
FIG. 3 is a diagram illustrating a signal converting device according to a second embodiment of the present invention.

However, when the square wave generator 200 is coupled to the signal converting device 100, the phases of the reference square wave Sr, the first auxiliary square wave Sas1, and the second auxiliary square wave Sas2 may deviate from their predetermined values due to the unbalanced loading between the reference mixer 1024, to the auxiliary mixer 1044, and the auxiliary mixer 1064 as shown in FIG. 3. FIG. 3 is a diagram illustrating a signal converting device 300 according to a second embodiment of the present invention. For brevity, the reference mixer 1024, the auxiliary mixer 1044, and the auxiliary mixer 1064 (i.e., the sub-mixers of the signal converting device 300) are illustrated as three field-effected transistors M1, M2, M3 employed for receiving the reference square wave Sr, the first auxiliary square wave Sas1, and the second auxiliary square wave Sas2 to modulate the reference amplified signal Sra, the first auxiliary amplified signal Sam1, and the second auxiliary amplified signal Sam2 respectively, in which the ratio between the sizes of the three field-effected transistors M1, M2, M3 is $1:\sqrt{2}:1$. It should be noted that the reason to design the sizes of the three field-effected transistors M1, M2, M3 to be $1:\sqrt{2}:1$ is to make the turn-on resistance ratio between of the three field-effected transistors M1, M2, M3 keeping on a predetermined ratio, such as $\sqrt{2}:1:\sqrt{2}$. Therefore, the sizes of the three field-effected transistors M1, M2, M3 are not adjusted when the gains (e.g. transconductance, gm) of the reference gain stage 1022, the auxiliary gain stages 1042, 1062 are adjusted after the calculation. However, the different sizes between the reference mixer 1024, to the auxiliary mixer 1044, and the auxiliary mixer 1064 may cause the phases of the reference square wave Sr, the first auxiliary square wave Sas1, and the second auxiliary square wave Sas2 to deviate from their predetermined values, i.e., the phase imbalance.

More specifically, according to the above-mentioned circumstance, the reference square wave Sr is expressed by $$P_0\left(t + \theta_0 \frac{T}{2\pi}\right),$$

the first auxiliary square wave Sas1 is expressed by $$P_0\left(t - \frac{T}{8} + \theta_1 \frac{T}{2\pi}\right),$$

and the second auxiliary square wave Sas2 is expressed by $$P_0\left(t + \frac{T}{8} + \theta_2 \frac{T}{2\pi}\right)$$

when the square wave generator 200 is coupled to the signal converting device 100, wherein the function $P_0(t)$ represents a square wave signal, T is the period of the square wave signal, $\theta_0$ represents the phase error of the reference square wave Sr, $\theta 1$ represents the phase error of the first auxiliary square wave Sas1, and $\theta_2$ represents the phase error of the second auxiliary square wave Sas2. In addition, the function $P_0(t)$ can be expanded as the following equation (1):

$$P_0(t) = \frac{4}{\pi}\left[\cos(\omega t) - \frac{1}{3}\cos(3\omega t) + \frac{1}{5}\cos(5\omega t) - \frac{1}{7}\cos(7\omega t) + \frac{1}{9}\cos(9\omega t) \ldots\right]. \quad (1)$$

Moreover, the reference gain Ar is expressed by $\sqrt{2}(1+\alpha_0)$, the first auxiliary gain Aa1 is expressed by $(1+\alpha_1)$, and the second auxiliary gain Aa2 is expressed by $(1+\alpha_2)$, wherein $\alpha_0$ represents the gain error of the reference gain stage 1022, $\alpha_1$ represents the gain error of the auxiliary gain stage 1042, and $\alpha_2$ represents the gain error of the auxiliary gain stage 1062.

Therefore, after normalization, the reference mixing output signal $P_{0M}(t)$ can be expressed by the following equation (2):

$$P_{0M}(t) = (1+\alpha_0)P_0\left(t + \theta_0 \frac{T}{2\pi}\right), \quad (2)$$

the first auxiliary mixing output signal $P_{1M}(t)$ can be expressed by the following equation (3):

$$P_{1M}(t) = (1+\alpha_1)\frac{1}{\sqrt{2}}P_0\left(t - \frac{T}{8} + \theta_1 \frac{T}{2\pi}\right), \quad (3)$$

and the second auxiliary mixing output signal $P_{2M}(t)$ can be expressed by the following equation (4):

$$P_{2M}(t) = (1+\alpha_2)\frac{1}{\sqrt{2}}P_0\left(t + \frac{T}{8} + \theta_2 \frac{T}{2\pi}\right). \quad (4)$$

In this exemplary embodiment, the reference signal-mixing circuit 102 is designed to be the reference circuit of the first auxiliary signal-mixing circuit 104 and the second auxiliary signal-mixing circuit 106. Therefore, the gain error $\alpha_0$ of the reference gain stage 1022 and the phase error $\theta_0$ of the reference square wave Sr are set to zero for brevity. Then, the gain errors $\alpha_1$, $\alpha_2$ (i.e., the Amplitude Mismatch, AM) of the auxiliary gain stages 1042, 1062 can be expressed by the following equations (5) & (6) respectively:

$$\alpha_1 = \sqrt{2}\frac{I_1}{I_0} - 1, \quad (5)$$

$$\alpha_2 = \sqrt{2}\frac{I_2}{I_0} - 1. \quad (6)$$

The phase errors $\theta_1$, $\theta_2$ (i.e., the Phase Imbalance) of the first auxiliary square wave Sas1 and the second auxiliary square wave Sas2 can be expressed by the following equations (7) & (8) respectively:

$$\theta_1 = \frac{P(I_0) - P(I_1)}{n} - 45°, \quad (7)$$

$$\theta_2 = \frac{P(I_2) - P(I_0)}{n} - 45°. \quad (8)$$

It should be noted that the above parameters $I_0$, $I_1$, and $I_2$ are the output currents of the reference mixer 1024, the auxiliary mixer 1044, and auxiliary mixer 1064 respectively as shown in FIG. 1, $P(I_0)$, $P(I_1)$, and $P(I_2)$ are the corresponding steady-state phases of the output currents, and the parameter n represents the order of the square wave which $P(I_i)(i=0, 1, 2)$ is modulated from.

Accordingly, after the reference mixing output signal $P_{0M}(t)$, the first auxiliary mixing output signal $P_{1M}(t)$, and the second auxiliary mixing output signal $P_{2M}(t)$ are combined by the combining circuit 110, the third order harmonic rejection ratio HRR3 and the fifth order harmonic rejection ratio HRR5 of the output signal So can be expressed by the following equations (9) & (10):

$$HRR3 = 10\log \frac{9\left[\begin{array}{c}2 + (1+\alpha_1)(\cos\theta_1 + \sin\theta_1) + \\ (1+\alpha_2)(\cos\theta_2 - \sin\theta_2)\end{array}\right]^2 + A}{\left[\begin{array}{c}-2 + (1+\alpha_1)(\cos 3\theta_1 - \sin 3\theta_1) + \\ (1+\alpha_2)(\cos 3\theta_2 + \sin 3\theta_2)\end{array}\right]^2 + B} \quad (9)$$

wherein $A = 9[(1+\alpha_1)(\cos\theta_1 - \sin\theta_1) - (1+\alpha_2)(\cos\theta_2 + \sin\theta_2)]^2$, and $B = [(1+\alpha_1)(-\cos 3\theta_1 - \sin 3\theta_1) + (1+\alpha_2)(\cos 3\theta_2 - \sin 3\theta_2)]^2$; and $$HRR5 = 10\log \frac{25\left[\begin{array}{c}2 + (1+\alpha_1)(\cos\theta_1 + \sin\theta_1) + \\ (1+\alpha_2)(\cos\theta_2 - \sin\theta_2)\end{array}\right]^2 + C}{\left[\begin{array}{c}2 - (1+\alpha_1)(\cos 5\theta_1 + \sin 5\theta_1) - \\ (1+\alpha_2)(\cos 5\theta_2 - \sin 5\theta_2)\end{array}\right]^2 + D} \quad (10)$$

wherein $C = 25[(1+\alpha_1)(\cos\theta_1 - \sin\theta_1) - (1+\alpha_2)(\cos\theta_2 + \sin\theta_2)]^2$, and $D = [-(1+\alpha_1)(\cos 5\theta_1 - \sin 5\theta_1) + (1+\alpha_2)(\cos 5\theta_2 + \sin 5\theta_2)]^2$.

According to equations (9) & (10), the third order harmonic rejection ratio HRR3 and the fifth order harmonic rejection ratio HRR5 of the output signal So are determined by four variables, i.e., $\alpha_1, \alpha_2, \theta_1, \theta_2$. If the phase errors $\theta_1, \theta_2$ of the first auxiliary square wave Sas1 and the second auxiliary square wave Sas2 respectively can be determined, the third order harmonic rejection ratio HRR3 and the fifth order harmonic rejection ratio HRR5 of the output signal So versus amplitude mismatches $\alpha_1, \alpha_2$ can be plotted in three dimensional (3D) diagrams.

Figure 4A:
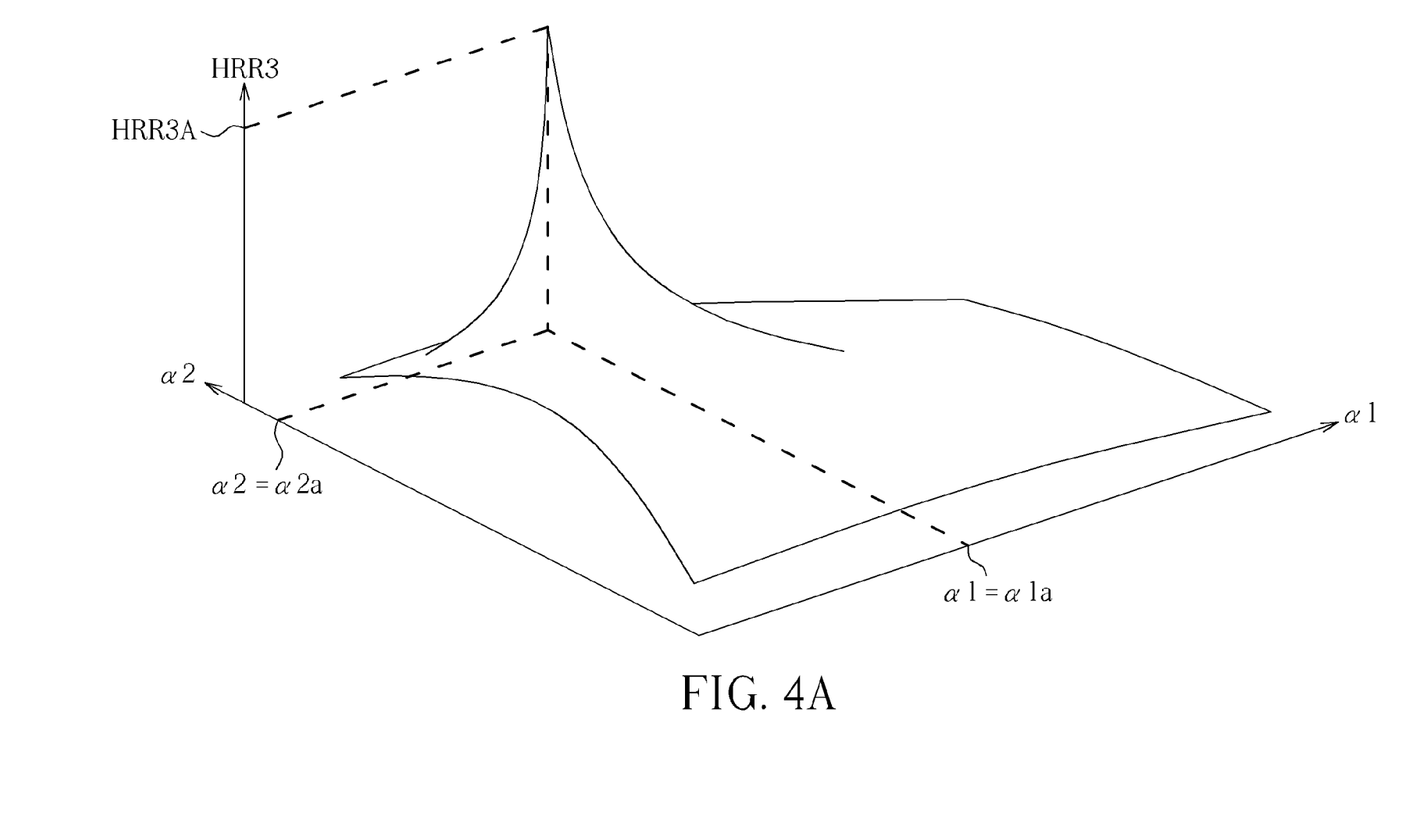
FIG. 4A is a three dimensional diagram illustrating a third order harmonic rejection ratio of an output signal corresponding to a first oscillating frequency of a reference square wave according to an embodiment of the present invention.
Figure 4B:
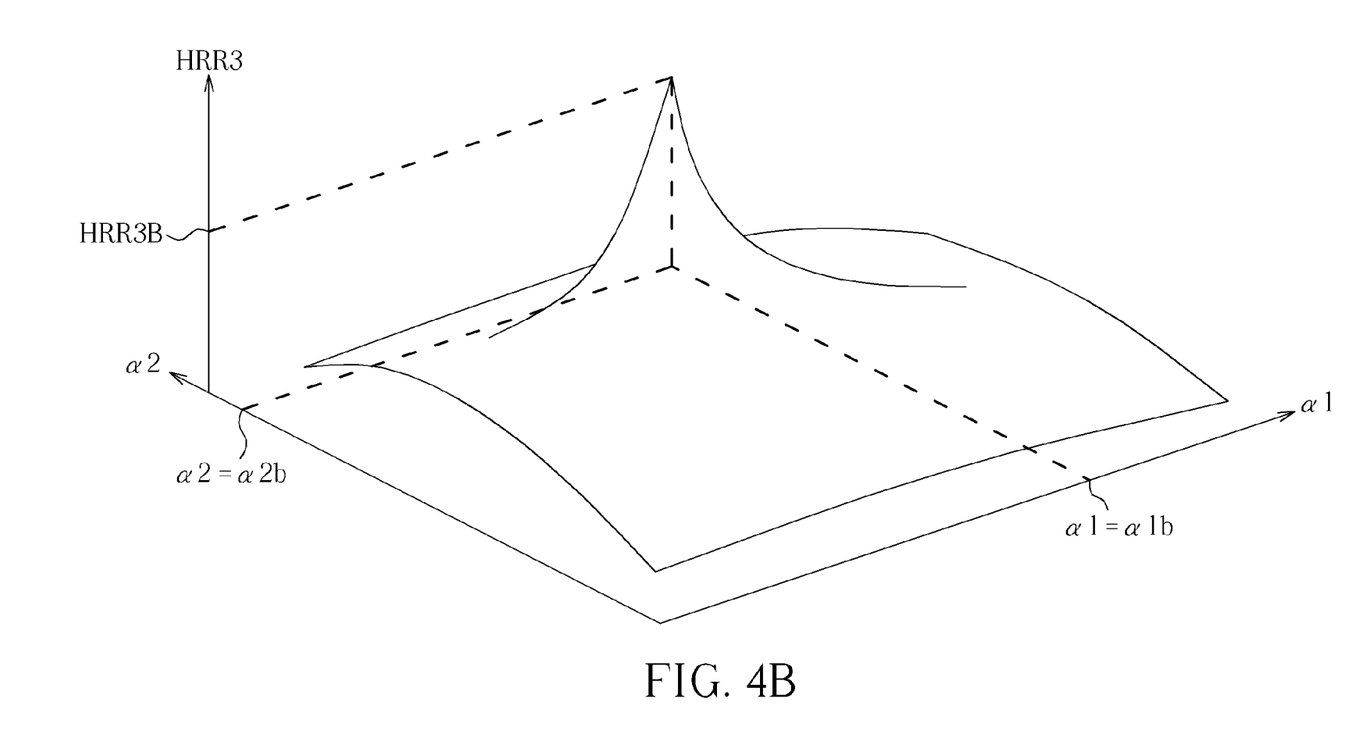
FIG. 4B is a three dimensional diagram illustrating a third order harmonic rejection ratio of an output signal corresponding to a second oscillating frequency of a reference square wave according to an embodiment of the present invention.

To clearly illustrate the features of this exemplary embodiment, the distribution of the third order harmonic rejection ratio HRR3 of the output signal So is shown in FIG. 4A and FIG. 4B, wherein FIG. 4A is a three dimensional diagram illustrating the third order harmonic rejection ratio HRR3 of the output signal So corresponding to a first oscillating frequency of the reference square wave Sr according to a first embodiment of the present invention. FIG. 4B is a three dimensional diagram illustrating the third order harmonic rejection ratio HRR3 of the output signal So corresponding to a second oscillating frequency of the reference square wave Sr according to a second embodiment of the present invention. It should be noted that the oscillating frequency of the reference square wave Sr corresponding to FIG. 4A is higher than the oscillating frequency of the reference square wave Sr corresponding to FIG. 4B. In other words, the phase imbalances of the first auxiliary square wave Sas1 and the second auxiliary square wave Sas2 may differ from different oscillating frequencies, thus the optimal third order harmonic rejection ratios may appear in the different amplitude mismatches, i.e. $\alpha_1, \alpha_2$.

In this exemplary embodiment, another processing device (not shown) may be utilized for sweeping the variables $\alpha_1, \alpha_2$ of the equation (9) to obtain the distribution of the third order harmonic rejection ratio HRR3 as shown in FIG. 4A. Therefore, for the first oscillating frequency of the reference square wave Sr, the optimal third order harmonic rejection ratio HRR3A appears in the position of when $\alpha_1 = \alpha_{1a}, \alpha_2 = \alpha_{2a}$. When the coordination of the optimal third order harmonic rejection ratio HRR3A is obtained by the processing device, the processing device is then arranged to adjust the first auxiliary gain Aa1 of the auxiliary gain stage 1042 and the second auxiliary gain Aa2 of the auxiliary gain stage 1062 to a first adjusted auxiliary gain and a second adjusted auxiliary gain according to $\alpha_{1a}$ and $\alpha_{2a}$ respectively. More specifically, in one exemplary embodiment, the first adjusted auxiliary gain and the second adjusted auxiliary gain can be set as $(1+\alpha_{1a})$ and $(1+\alpha_{2a})$ respectively. Accordingly, for the first oscillating frequency of the reference square wave Sr, the third order harmonic rejection ratio HRR3 of the output signal So generated by the signal converting device 100 is controlled to be the optimal third order harmonic rejection ratio HRR3A.

Furthermore, for the second oscillating frequency of the reference square wave Sr, the optimal third order harmonic rejection ratio HRR3B appears in the position of when $\alpha_1 = \alpha_{1b}, \alpha_2 = \alpha_{2b}$. When the coordination of the optimal third order harmonic rejection ratio HRR3B is obtained by the processing device, the processing device is then arranged to adjust the first auxiliary gain Aa1 of the auxiliary gain stage 1042 and the second auxiliary gain Aa2 of the auxiliary gain stage 1062 to another first adjusted auxiliary gain and another second adjusted auxiliary gain according to $\alpha_{1b}$ and $\alpha_{2b}$ respectively. Similarly, in this exemplary embodiment, the first adjusted auxiliary gain and the second adjusted auxiliary gain can be set as $(1+\alpha_{1b})$ and $(1+\alpha_{2b})$ respectively. Accordingly, for the second oscillating frequency of the reference square wave Sr, the third order harmonic rejection ratio HRR3 of the output signal So generated by the signal converting device 100 is controlled to be the optimal third order harmonic rejection ratio HRR3B.

Therefore, by adjusting the first auxiliary gain Aa1 of the auxiliary gain stage 1042 and the second auxiliary gain Aa2 of the auxiliary gain stage 1062 according to the operating frequency (i.e., the oscillating frequency of the reference square wave Sr), the amplitudes of the reference amplified signal Sra, the first auxiliary amplified signal Sam1, and the second auxiliary amplified signal Sam2 are adjusted to the required amplitudes (i.e. the optimum amplitudes) before inputting into the reference mixer 1024, auxiliary mixers 1044, 1064 respectively. Accordingly, the third order harmonic rejection ratio HRR3 of the output signal So generated by the signal converting device 100 is increased to the optimal third order harmonic rejection ratio. Furthermore, the first auxiliary gain Aa1 and the second auxiliary gain Aa2 may be adjusted via the adjustment of transconductances (i.e. gm) of the auxiliary gain stages 1042, 1062.

It is noted that those skilled in the art may easily understand that the fifth order harmonic rejection ratio HRR5 in the output signal So can also be increased by the similar way, thus the detailed description is omitted here for brevity. Furthermore, those skilled in the art may easily understand that the embodiments can be modified to be applied to the higher order HRM schemes, such as $5^{th}$ order HRM (i.e., having 5 sub-mixers with 30° phase difference), $7^{th}$ order HRM (i.e., having 7 sub-mixers with 22.5° phase difference).

Moreover, when the input signal Si of the signal converting device 300 is a radio frequency (RF) signal, the coupling capacitors (i.e., 302-312 in FIG. 3) existing between the gate terminal and the source/drain terminal of a field-effected transistor can be a serious problem. More specifically, for example, when a high frequency RF signal Srf (e.g., an RF interference) is coupled to the output of the second field-effected transistor M2 through capacitors 306 and 308, the output of the first field-effected transistor M1 will also see this Srf due to large impedance at node Nc, a self-mixing between the high frequency RF signal Srf and the harmonic of reference square wave Sr may occur and generate an inverse downconverted signal Sfb As a result, the effective reference mixing output signal will be a sum of $P_{OM}(t)$ and Sfb. Hence, the phase errors will deviate from original values $\theta_1, \theta_2$. Therefore, the adjusting circuit 108 is further arranged to couple to the common output node Nc of the reference signal-mixing circuit 102 and the auxiliary signal-mixing circuits 104, 106 to reduce the input impedance Ri of the combining circuit 110 to reduce the self-mixing effect.

According to an exemplary embodiment of the present invention, the adjusting circuit 108 may be an adjustable capacitor as shown in FIG. 3, wherein the capacitance of the adjustable capacitor is varied in accordance with the oscillating frequency of the reference square wave Sr. When the adjustable capacitor is coupled between the common output node Nc and the ground voltage Vgnd, the adjustable capacitor operates to bypass the high frequency RF signal Srf to the ground voltage Vgnd by adjusting the capacitance of the adjustable capacitor to be inversely proportional to the oscillating frequency of the reference square wave Sr. More specifically, the adjustable capacitor provides a low impedance path between the common output node Nc and the ground voltage Vgnd to bypass the high frequency RF signal Srf to the ground voltage Vgnd. Accordingly, the problem of self-mixing between the high frequency RF signal Srf and the harmonic of reference square wave Sr is solved.

It should be noted that the present invention is not limited to using the adjustable capacitor to implement the adjusting circuit 108, any other circuits having the similar characteristics, such as an adjustable inductor-capacitor tank, also belong to the scope of the present invention.

Furthermore, in another exemplary embodiment of the present invention, the adjusting circuit 108 can also be implemented by merely a capacitor, where the capacitor has a fixed capacitance. In this exemplary embodiment, the variables $\alpha_1$, $\alpha_2$ can be determined by the above equations (9) or (10) where the equation corresponds to the high operating frequency. Then, for the case of low operating frequency, another bypass capacitor may be added to compensate the capacitor to bypass the high frequency RF signal Srf to the ground voltage Vgnd.

Moreover, even though the signal converting device 100 comprises one reference signal-mixing circuit and two auxiliary signal-mixing circuits in the above embodiment, this is not a limitation of the present invention. In other words, the reference signal-mixing circuit can also be regarded as another auxiliary signal-mixing circuit in a signal converting device. More specifically, in another preferred embodiment, the signal converting device may comprise a plurality of signal-mixing circuits and a combining circuit. Each of signal-mixing circuits is arranged to receive an input signal and local oscillating signals having different phases, and each of the signal-mixing circuits is arranged to receive a different one of the local oscillator signals and being adapted to: apply a gain to the input signal to generate an amplified input signal, the gain being set according to a relationship of harmonic rejection ratios with respect to amplitude mismatches of the signal-mixing circuits; and generate an amplitude modulated mixed signal indicative of a product of the amplified input signal and the local oscillator signal. The combining circuit is arranged to combine the amplitude modulated mixed signals generated by the signal-mixing circuits to provide an output signal. It is noted that those skilled in this may be easy to understand the operation of this embodiment after reading the disclosure of the above-mentioned embodiment, thus the detailed description is omitted here for brevity.

Figure 5:
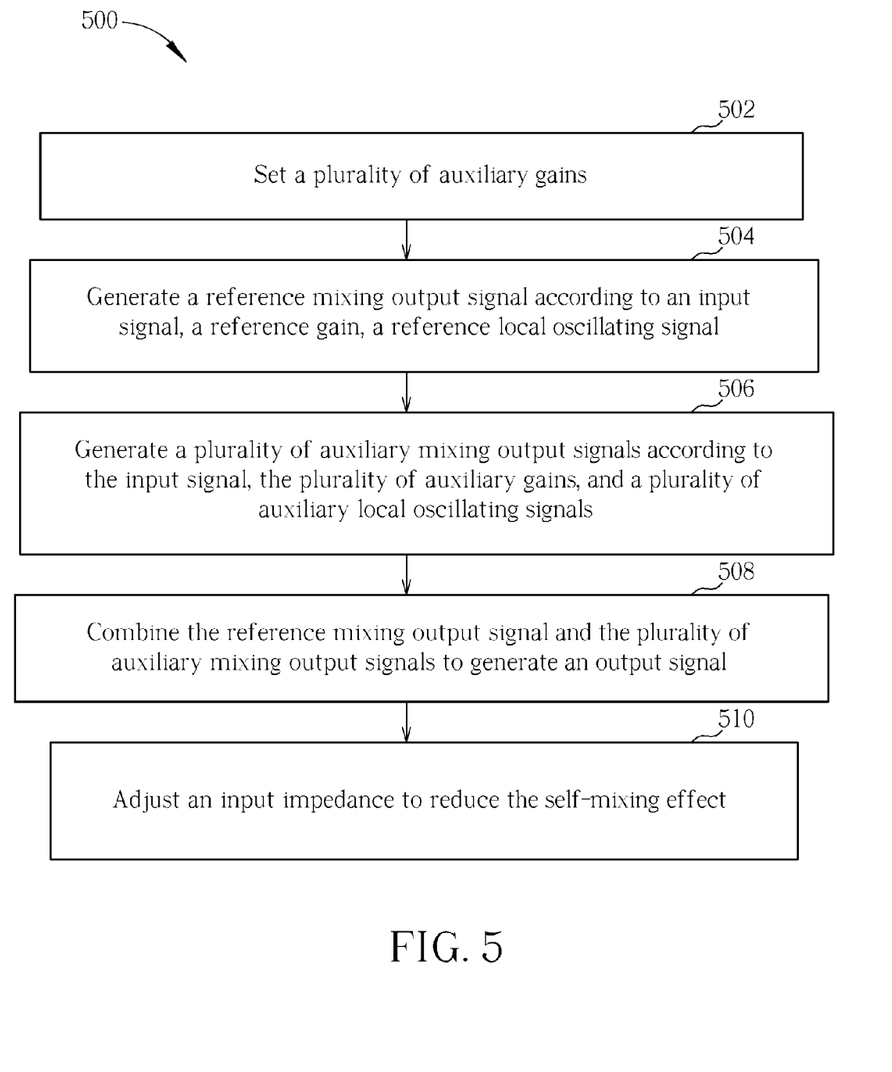
FIG. 5 is a flowchart illustrating an operation of the signal converting device according to an embodiment of the present invention.

Accordingly, the operation of the above exemplary embodiment 300 can be summarized in the steps of FIG. 5. FIG. 5 is a flowchart illustrating an operation 500 of the signal converting device 300 according to an embodiment of the present invention. Provided that substantially the same result is achieved, the steps of the flowchart shown in FIG. 5 need not to be in the exact order shown and need not to be contiguous, that is, other steps can be intermediate. The operation 500 of the signal converting device 300 comprises the steps:

Step 502: Set the plurality of auxiliary gains Aa1, Aa2 of a plurality of auxiliary signal-mixing circuits (e.g., the auxiliary signal-mixing circuits 104, 106) respectively;

Step 504: Arrange a reference signal-mixing circuit (e.g., the reference signal-mixing circuit 102) to generate the reference mixing output signal $P_{OM}(t)$ according to the input signal Si, the reference gain Ar, and the reference local oscillating signal Sr;

Step 506: Arrange each of the plurality of auxiliary signal-mixing circuits (e.g., the plurality of auxiliary signal-mixing circuits 104, 106) to generate an auxiliary mixing output signal according to the input signal, an auxiliary gain, and an auxiliary local oscillating signal;

Step 508: Arrange a combining circuit (e.g., the combining circuit 110) to combine the reference mixing output signal $P_{OM}(t)$ and the plurality of auxiliary mixing output signals $P_{1M}(t)$, $P_{2M}(t)$ to generate the output signal So;

Step 510: Adjust the input impedance Ri of the combining circuit to reduce the self-mixing effect.

Figure 6:
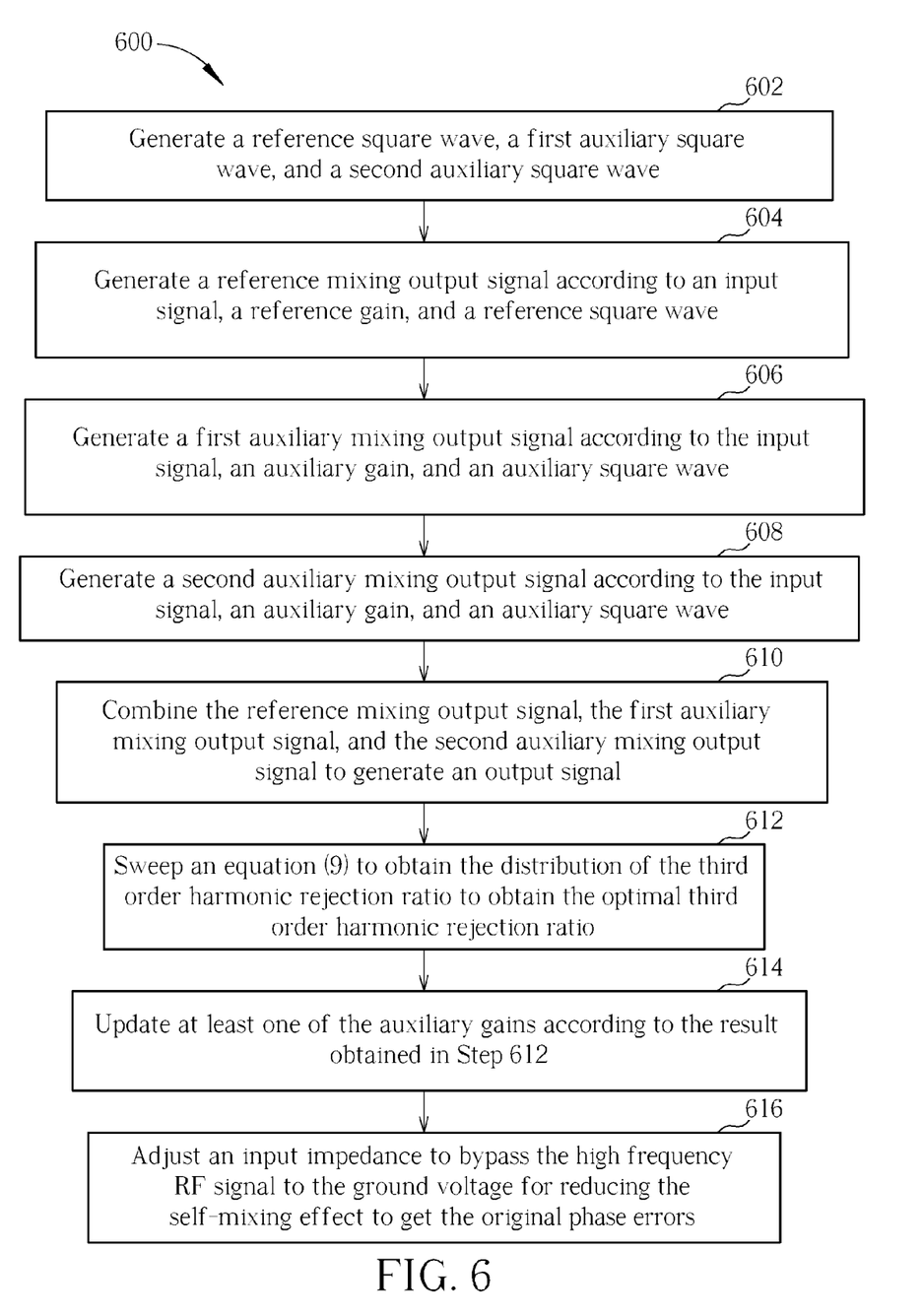
FIG. 6 is a flowchart illustrating a harmonic rejection method according to an embodiment of the present invention.

Furthermore, the operation of obtaining the optimal auxiliary gains Aa1, Aa2 of the auxiliary signal-mixing circuits 104, 106 respectively can be summarized in the steps of FIG. 6. FIG. 6 is a flowchart illustrating a harmonic rejection method 600 according to an embodiment of the present invention. Provided that substantially the same result is achieved, the steps of the flowchart shown in FIG. 6 need not to be in the exact order shown and need not to be contiguous, that is, other steps can be intermediate. The harmonic rejection method 600 comprises the steps:

Step 602: Arrange a square wave generator (e.g., the square wave generator 200) to generate the reference square wave Sr, the first auxiliary square wave Sas1, and the second auxiliary square wave Sas2;

Step 604: Arrange a reference signal-mixing circuit (e.g., the reference signal-mixing circuit 102) to generate the reference mixing output signal $P_{OM}(t)$ according to the input signal Si, the reference gain Ar (i.e., $\sqrt{2}$), and the reference square wave Sr;

Step 606: Arrange a first auxiliary signal-mixing circuit (e.g., the auxiliary signal-mixing circuit 104) to generate the first auxiliary mixing output signal $P_{1M}(t)$ according to the input signal Si, the auxiliary gain Aa1 (i.e., 1), and the auxiliary square wave Sas1;

Step 608: Arrange a second auxiliary signal-mixing circuit (e.g., the auxiliary signal-mixing circuit 106) to generate the second auxiliary mixing output signal $P_{2M}(t)$ according to the input signal Si, the auxiliary gain Aa2 (i.e., 1), and the auxiliary square wave Sas2;

Step 610: Arrange a combining circuit (e.g., the combining circuit 110) to combine the reference mixing output signal $P_{OM}(t)$, the first auxiliary mixing output signal $P_{1M}(t)$, and the second auxiliary mixing output signal $P_{2M}(t)$ to generate an output signal So;

Step 612: Sweep the variables $\alpha_1$, $\alpha_2$ of the equation (9) to obtain the distribution of the third order harmonic rejection ratio HRR3 to obtain the optimal third order harmonic rejection ratio HRR3A;

Step 614: Update at least one of the auxiliary gains Aa1, Aa2 of the first and second auxiliary signal-mixing circuits according to the result obtained in Step 612;

Step 616: Arrange an adjusting circuit (e.g., the adjusting circuit 108) to adjust the input impedance Ri of the combining circuit to bypass the high frequency RF signal to the ground voltage for reducing the self-mixing effect to get the original phase errors $\theta_1$, $\theta_2$.

According to the description of the above exemplary embodiment, the reference signal-mixing circuit 102 is designed to be the reference circuit of the first auxiliary signal-mixing circuit 104 and the second auxiliary signal-mixing circuit 106, therefore at least one of the auxiliary gains Aa1, Aa2 of the auxiliary signal-mixing circuits 104, 106 can be adjusted to make the third order harmonic rejection ratio HRR3 to be the optimal third order harmonic rejection ratio HRR3A in steps 612-614. Furthermore, to avoid the occurrence of the self-mixing between the high frequency RF signal Srf and the harmonic of the reference square wave Sr, to the harmonic of the first auxiliary square wave Sas1 and the harmonic of the second auxiliary square wave Sas2, the adjusting circuit 108 (e.g., the adjustable capacitor) is further arranged to couple to the common output node Nc of the reference signal-mixing circuit 102 and the auxiliary signal-mixing circuits 104, 106 to bypass the high frequency RF signal Srf to the ground voltage Vgnd by adjusting the capacitance of the adjustable capacitor to be inversely proportional to the oscillating frequency of the reference square wave Sr in step 616.

Briefly, the embodiments of the present invention adjust at least one of the reference gain Ar of the reference gain stage 1022, the first auxiliary gain Aa1 of the auxiliary gain stage 1042, and the second auxiliary gain Aa2 of the auxiliary gain stage 1062 to compensate the phase imbalance between the reference mixer 1024, the auxiliary mixer 1044, and auxiliary mixer 1064. In addition, an adjusting circuit is further arranged to bypass the high frequency RF signal Srf to the ground voltage Vgnd. As no complex circuit is introduced in the above exemplary embodiments, the embodiments are easy to be implemented and do not consume much power of the whole system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal converting device, comprising:
a reference signal-mixing circuit, arranged to generate a reference mixing output signal according to an input signal, a reference gain, and a reference local oscillating signal;
a plurality of auxiliary signal-mixing circuits, each arranged to generate an auxiliary mixing output signal according to the input signal, an auxiliary gain, and an auxiliary local oscillating signal; and
a combining circuit, arranged to combine the reference mixing output signal and a plurality of the auxiliary mixing output signals to generate an output signal, wherein the corresponding auxiliary gain of at least one of the auxiliary signal-mixing circuits is adjusted according to a gain error of the at least one of the auxiliary signal-mixing circuits to compensate phase imbalances between the reference mixing output signal and each of the auxiliary mixing output signals to reduce a power of a harmonic component in the output signal.

2. The signal converting device of claim 1, wherein the corresponding auxiliary gain is set according to a relationship of harmonic rejection ratios with respect to amplitude mismatches of the reference signal-mixing circuit and the auxiliary signal-mixing circuits.

3. The signal converting device of claim 1, wherein the corresponding auxiliary gain is set according to an oscillating frequency of the auxiliary local oscillating signal.

4. The signal converting device of claim 1, wherein the reference local oscillating signal and the auxiliary local oscillating signals are square waves.

5. The signal converting device of claim 1, wherein a phase of at least one auxiliary local oscillating signal is deviated from a predetermined phase.

6. The signal converting device of claim 1, wherein the reference signal-mixing circuit comprises:
a reference gain stage, arranged to provide the reference gain upon the input signal to generate a reference amplified signal; and
a reference mixer, arranged to modulate the reference amplified signal according to the reference local oscillating signal to generate the reference mixing output signal; and
each of the auxiliary signal-mixing circuits comprises:
an auxiliary gain stage, arranged to provide the auxiliary gain upon the input signal to generate an auxiliary amplified signal; and
an auxiliary mixer, arranged to modulate the auxiliary amplified signal according to the auxiliary local oscillating signal to generate the auxiliary mixing output signal.

7. The signal converting device of claim 1, further comprising:
an adjusting circuit, coupled to a common output node of the reference signal-mixing circuit and the auxiliary reference signal-mixing circuits, arranged to adjust an input impedance of the combining circuit to reduce the power of the harmonic component in the output signal.

8. The signal converting device of claim 7, wherein the adjusting circuit is an adjustable capacitor.

9. The signal converting device of claim 8, wherein a capacitance of the adjustable capacitor is substantially inversely proportional to an oscillating frequency of the reference local oscillating signal.

10. The signal converting device of claim 7, wherein the adjusting circuit is an adjustable inductor-capacitor tank.

11. The signal converting device of claim 1, wherein the combining circuit is a trans-impedance amplifier (TIA).

12. The signal converting device of claim 1, wherein at least one of the reference gain and the plurality of auxiliary gains is an adjustable gain, and the adjustable gain is adjusted to reduce the power of the harmonic component in the output signal.

13. A signal converting device, comprising:
a plurality of signal-mixing circuits arranged to receive an input signal and local oscillating signals having different phases, wherein each of the signal-mixing circuits is arranged to receive a different one of the local oscillator signals and being adapted to:
apply a gain to the input signal to generate an amplified input signal, the gain being adjusted according to a relationship of harmonic rejection ratios with respect to amplitude mismatches of the signal-mixing circuits; and
generate an amplitude modulated mixed signal indicative of a product of the amplified input signal and the local oscillator signal; and
a combining circuit arranged to combine the amplitude modulated mixed signals generated by the signal-mixing circuits to provide an output signal.

14. The signal converting device of claim 13, wherein the local oscillating signals are square waves.

15. The signal converting device of claim 13, wherein each of the plurality of signal-mixing circuits comprises:

a gain stage, arranged to provide the gain upon the input signal to generate the amplified input signal; and a mixer, arranged to modulate the amplified input signal according to the local oscillator signal to generate the amplitude modulated mixed signal.

16. The signal converting device of claim 13, further comprising:

an adjusting circuit, coupled to a common output node of the plurality of signal-mixing circuits, arranged to adjust an input impedance of the combining circuit to reduce a power of a harmonic component in the output signal.

17. The signal converting device of claim 16, wherein the adjusting circuit is an adjustable capacitor.

18. The signal converting device of claim 17, wherein a capacitance of the adjustable capacitor is substantially inversely proportional to an oscillating frequency of the reference local oscillating signal.

19. The signal converting device of claim 16, wherein the adjusting circuit is an adjustable inductor-capacitor tank.

20. The signal converting device of claim 13, wherein the combining circuit is a trans-impedance amplifier (TIA).

21. A harmonic rejection method, comprising:

generating a reference mixing output signal according to an input signal, a reference gain, and a reference local oscillating signal;

generating a plurality of auxiliary mixing output signals each according to the input signal, an auxiliary gain, and an auxiliary local oscillating signal;

combining the reference mixing output signal and the auxiliary mixing output signals to generate an output signal; and wherein at least one of the plurality of auxiliary gains is adjusted according to a gain error occurs in the step of generating at least one of the plurality of auxiliary mixing output signals to compensate phase imbalances between the reference mixing output signal and each of the auxiliary mixing output signals to reduce a power of a harmonic component in the output signal.

22. The harmonic rejection method of claim 21, wherein the reference local oscillating signal and the auxiliary local oscillating signals are square waves.

23. The harmonic rejection method of claim 21, wherein a phase of at least one auxiliary local oscillating signal is deviated from a predetermined phase.

24. The harmonic rejection method of claim 23, wherein the step of generating the reference mixing output signal comprises:

providing the reference gain upon the input signal to generate a reference amplified signal; and modulating the reference amplified signal according to the reference local oscillating signal to generate the reference mixing output signal; and the step of generating the auxiliary mixing output signal comprises:

providing the auxiliary gain upon the input signal to generate an auxiliary amplified signal; and modulating the auxiliary amplified signal according to the auxiliary local oscillating signal to generate the auxiliary mixing output signal.

25. The harmonic rejection method of claim 21, further comprising:

adjusting an input impedance of the combining circuit to reduce the power of the harmonic component in the output signal.

26. The harmonic rejection method of claim 21, wherein at least one of the reference gain and the plurality of auxiliary gains is an adjustable gain, and the adjustable gain is adjusted to reduce the power of the harmonic component in the output signal.

* * * * *

UNITED STATES PATENT AND TRADEMARK OFFICE
CERTIFICATE OF CORRECTION

PATENT NO. : 8,552,790 B2  Page 1 of 1
APPLICATION NO. : 13/103102
DATED : October 8, 2013
INVENTOR(S) : Huajiang Zhang et al.

It is certified that error appears in the above-identified patent and that said Letters Patent is hereby corrected as shown below:

On the title page, item (75), correct the name of the second inventor from "Chun Giek Tan" to --Chun Geik Tan--.

Signed and Sealed this
Twenty-eighth Day of January, 2014

Michelle K. Lee
*Deputy Director of the United States Patent and Trademark Office*